(12) United States Patent
Namikawa

(10) Patent No.: US 8,597,456 B2
(45) Date of Patent: Dec. 3, 2013

(54) METHOD FOR PRODUCING ORGANIC EL DEVICE AND SUBSTRATE FOR PRODUCING ORGANIC EL DEVICE

(75) Inventor: Makoto Namikawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 12 days.

(21) Appl. No.: 13/347,275

(22) Filed: Jan. 10, 2012

(65) Prior Publication Data

US 2012/0177896 A1 Jul. 12, 2012

(30) Foreign Application Priority Data

Jan. 11, 2011 (JP) ................. 2011-003060

(51) Int. Cl.
| | | |
|---|---|---|
| B29C 65/50 | (2006.01) | |
| B32B 37/26 | (2006.01) | |
| B32B 38/10 | (2006.01) | |
| B32B 38/14 | (2006.01) | |
| B32B 43/00 | (2006.01) | |

(52) U.S. Cl.
USPC ............ 156/247; 156/277; 156/278; 156/714

(58) Field of Classification Search
USPC ......... 156/247, 277, 278, 280, 701, 714, 553; 385/14, 131
See application file for complete search history.

(56) References Cited

FOREIGN PATENT DOCUMENTS

| JP | 2009-271236 | 11/2009 | |
|---|---|---|---|
| WO | WO 9707172 A1 * | 2/1997 | ................. C09J 7/02 |
| WO | WO 2010114109 A2 * | 10/2010 | ............ G02B 6/122 |

* cited by examiner

Primary Examiner — Sing P Chan
(74) Attorney, Agent, or Firm — Sughrue Mion, PLLC

(57) ABSTRACT

A method for producing an organic EL device includes the steps of: preparing an adhesive sheet on which a resin substrate is laminated, allowing the resin substrate to adhere onto a hard substrate with the adhesive sheet interposed therebetween, forming an organic EL element on the resin substrate, thereby producing an organic EL device including the resin substrate and the organic EL element, and peeling the organic EL device from the hard substrate. The adhesive sheet includes a first adhesive layer for being bonded to the hard substrate, and a second adhesive layer formed on the first adhesive layer and bonded to the resin substrate. A non-adhesive region is defined at an end portion of the resin substrate, the non-adhesive region not overlapping with the second adhesive layer but overlapping with the first adhesive layer when projected in the thickness direction.

4 Claims, 9 Drawing Sheets

FIG.1
(a)
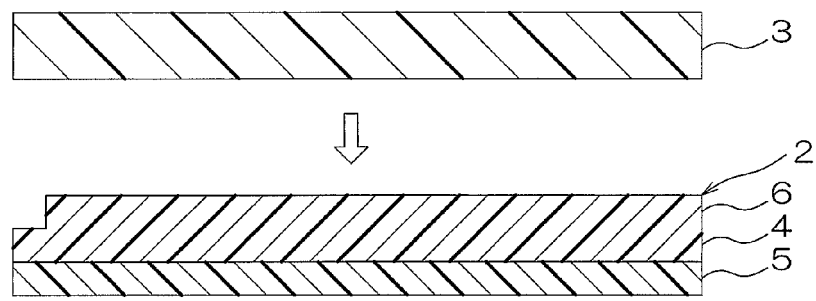
(b)
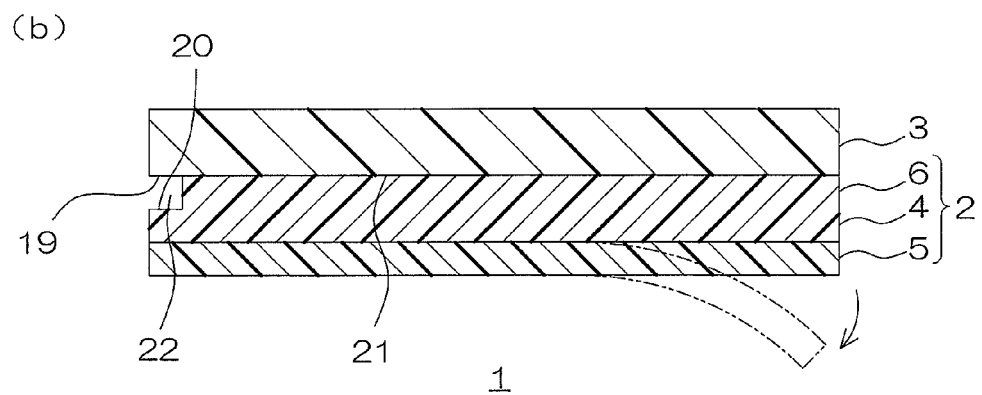

FIG.2
(a)
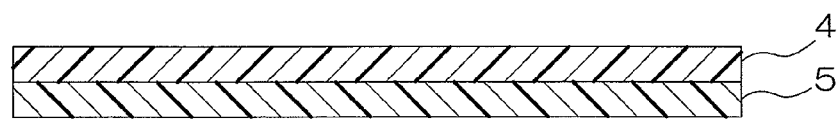
(b)
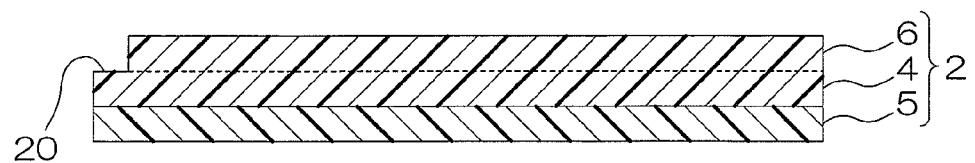

FIG.5
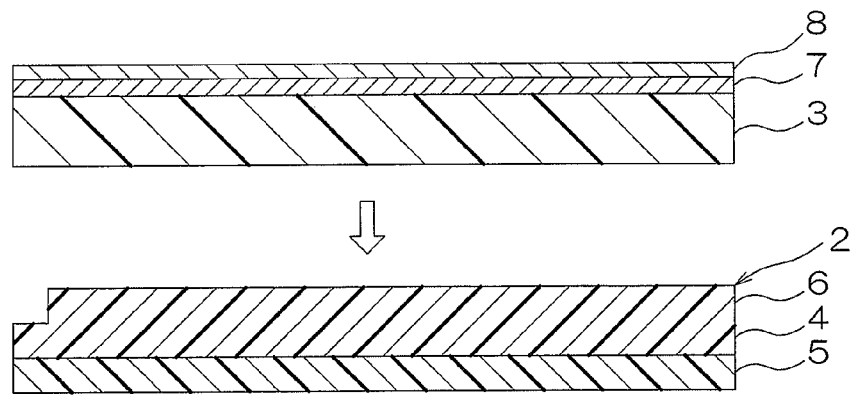
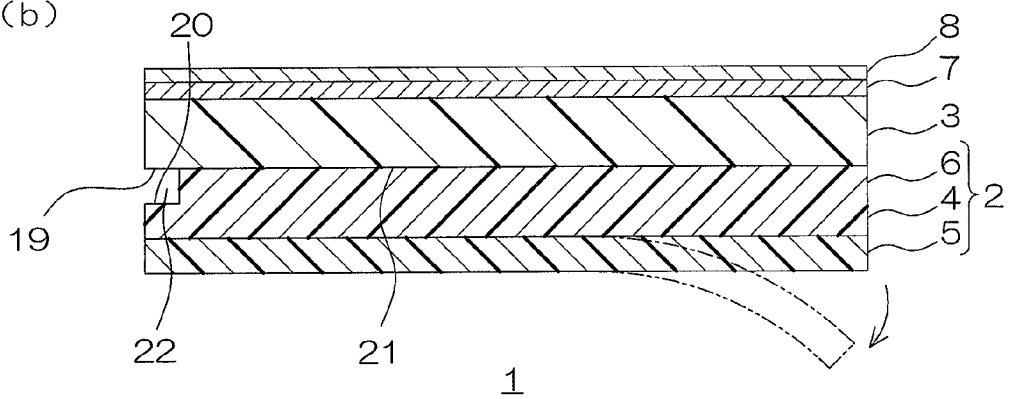

FIG.6
(a)
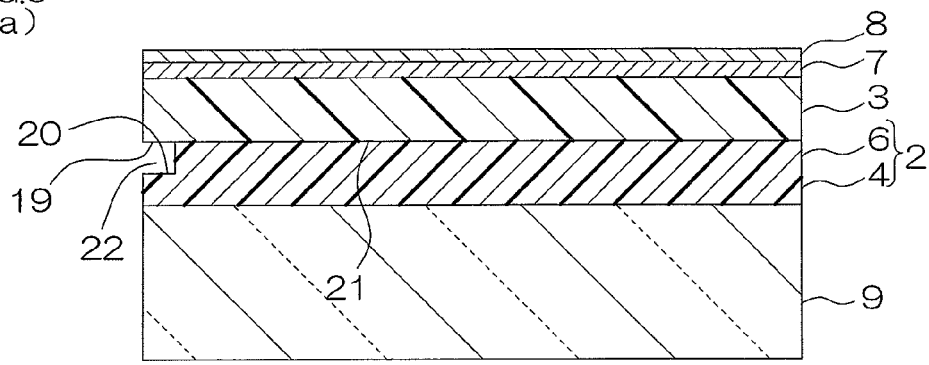
(b)
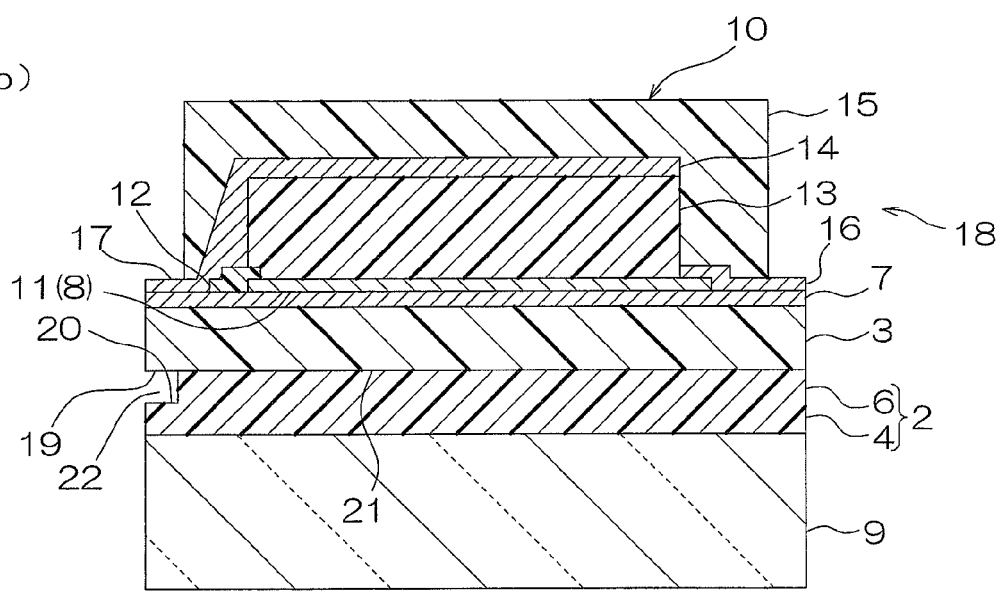
(c)
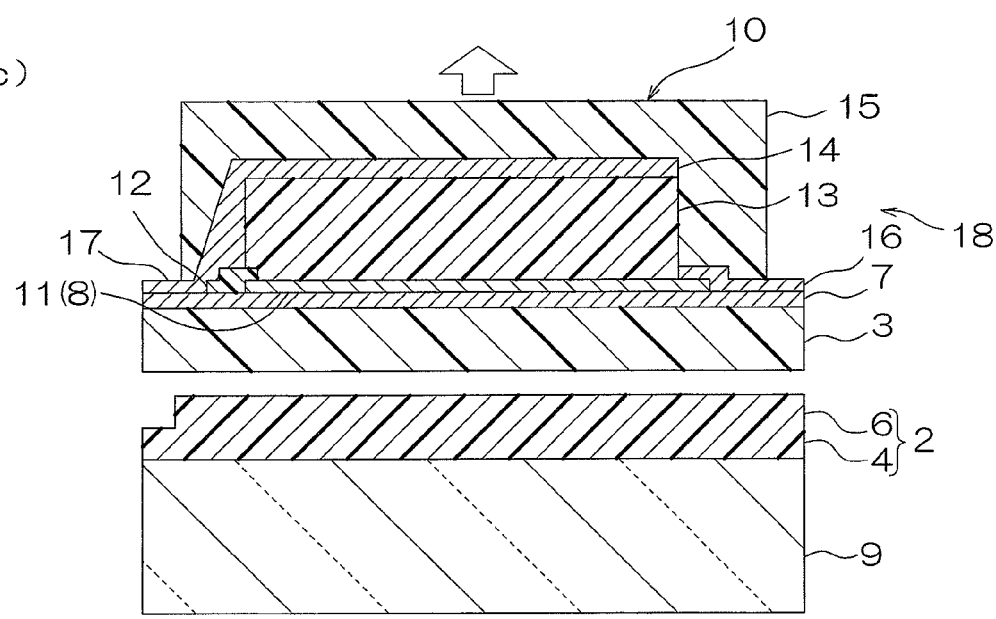

FIG.7
(a)
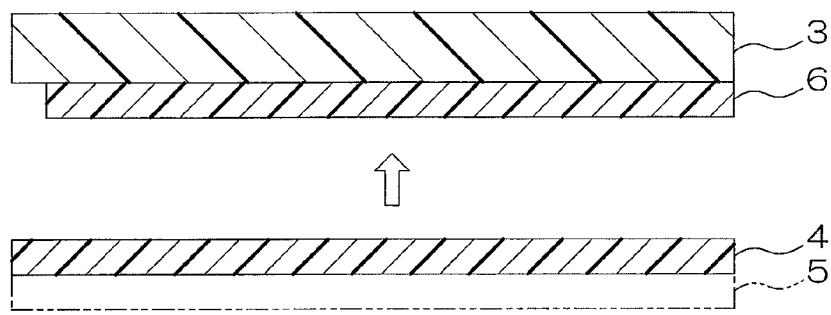
(b)
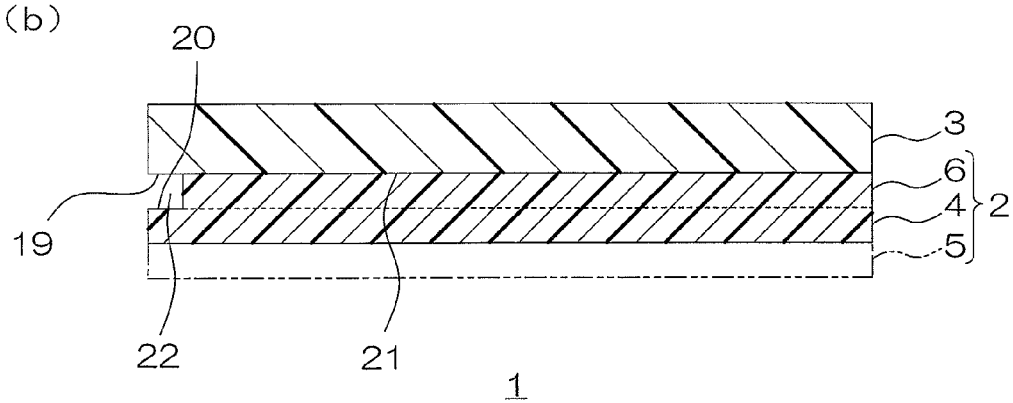

METHOD FOR PRODUCING ORGANIC EL DEVICE AND SUBSTRATE FOR PRODUCING ORGANIC EL DEVICE

CROSS-REFERENCE TO RELATED APPLICATION

The present application claims priority from Japanese Patent Application No. 2011-003060 filed on Jan. 11, 2011, the contents of which are hereby incorporated by reference into this application.

BACKGROUND OF THE INVENTION

1. Field of the Invention

The present invention relates to a method for producing an organic EL device and a substrate for producing an organic EL device, in particular, to a method for producing an organic EL device, and a substrate for producing an organic EL device, the substrate being used in the method for producing an organic EL device.

2. Description of Related Art

It has been known that an organic EL (electroluminescence) device includes a resin substrate, and an organic EL element laminated on the resin substrate.

As a method for producing such an organic EL device, for example, Japanese Unexamined Patent Publication No. 2009-271236 has proposed a method in which a resin substrate composed of polyethylenenaphthalate is allowed to adhere onto a glass substrate with an adhesive layer interposed therebetween, and then an organic EL element including an anode, a cathode, and an organic semiconductor layer is laminated on the resin substrate.

In Japanese Unexamined Patent Publication No. 2009-271236, the resin substrate is fixed onto the glass substrate with the adhesive layer interposed therebetween, to prevent warpage of the resin substrate when the organic EL element is produced on the resin substrate.

In addition, in Japanese Unexamined Patent Publication No. 2009-271236, after the production of the organic EL device, the glass substrate below the organic EL device is peeled from the resin substrate.

SUMMARY OF THE INVENTION

However, in the method proposed in Japanese Unexamined Patent Publication No. 2009-271236, when the glass substrate is peeled from the resin substrate of the organic EL device, it is required that peeling (interfacial peeling) is caused at the interface between the resin substrate and the adhesive layer, and that the adhesive layer that is unnecessary for the produced organic EL device is left at the surface of the glass substrate.

However, in the above-described peeling, the peeling (interfacial peeling) may be caused at the interface between the glass substrate and the adhesive layer, and the adhesive layer may remain at the surface of the resin substrate.

An object of the present invention is to provide a method for producing an organic EL device in which peeling can be reliably caused at the interface between the adhesive sheet and the resin substrate, and a substrate for producing an organic EL device, the substrate being used in the method.

A method for producing an organic EL device of the present invention includes the steps of preparing an adhesive sheet on which a resin substrate is laminated, allowing the resin substrate to adhere onto a hard substrate with the adhesive sheet interposed therebetween, forming an organic EL element on the resin substrate, thereby producing an organic EL device including the resin substrate and the organic EL element, and peeling the organic EL device from the hard substrate, wherein the adhesive sheet includes a first adhesive layer for being bonded to the hard substrate, and a second adhesive layer formed on the first adhesive layer and bonded to the resin substrate, and a non-adhesive region is defined at an end portion of the resin substrate, the non-adhesive region not overlapping with the second adhesive layer but overlapping with the first adhesive layer when projected in the thickness direction.

In the method for producing an organic EL device of the present invention, it is preferable that the bonding area to be bonded to the resin substrate in the adhesive sheet is smaller than the bonding area to be bonded to the hard substrate in the adhesive sheet.

In the method for producing an organic EL device of the present invention, it is preferable that the bonding area to be bonded to the resin substrate in the adhesive sheet is 10 to 99% relative to the bonding area to be bonded to the hard substrate in the adhesive sheet.

In a substrate for producing an organic EL device of the present invention, the substrate being used for a method for producing an organic EL device, the method including the steps of: preparing an adhesive sheet on which a resin substrate is laminated; allowing the resin substrate to adhere onto a hard substrate with the adhesive sheet interposed therebetween; forming an organic EL element on the resin substrate, thereby producing an organic EL device including the resin substrate and the organic EL element; and peeling the organic EL device from the hard substrate, wherein the substrate includes the adhesive sheet, and the resin substrate laminated on the adhesive sheet; the adhesive sheet includes a first adhesive layer for being bonded to the hard substrate, and a second adhesive layer formed on the first adhesive layer and bonded to the resin substrate; and a non-adhesive region is defined at an end portion of the resin substrate, the non-adhesive region not overlapping with the second adhesive layer but overlapping with the first adhesive layer when projected in the thickness direction.

In the substrate for producing an organic EL device of the present invention, it is preferable that a gap is formed between the non-adhesive region of the resin substrate and the first adhesive layer.

In the substrate for producing an organic EL device of the present invention, it is preferable that the bonding area to be bonded to the resin substrate in the adhesive sheet is smaller than the bonding area to be bonded to the hard substrate in the adhesive sheet.

In the substrate for producing an organic EL device of the present invention, it is preferable that the bonding area to be bonded to the resin substrate in the adhesive sheet is 10 to 99% relative to the bonding area to be bonded to the hard substrate in the adhesive sheet.

In the substrate for producing an organic EL device of the present invention, it is preferable that a shielding layer for preventing gas to permeate the resin substrate is further provided, the shielding layer being formed on the top face of the resin substrate; and it is preferable that a transparent conductive thin film formed on the top face of the shielding layer is further provided.

With the method for producing an organic EL device of the present invention, and the substrate for producing an organic EL device used in the method, in the step of peeling the organic EL device from the hard substrate, the peeling is conducted uniformly from the non-adhesive region of the resin substrate continuously to the adhesive region of the resin substrate at the interface between the region to be bonded to the second adhesive layer and the second adhesive layer.

Therefore, the adhesive sheet unnecessary for the produced organic EL device can be left at the hard substrate, reliably preventing the adhesive sheet from remaining at the resin substrate included in the organic EL device.

Thus, a highly reliable organic EL device can be produced.

BRIEF DESCRIPTION OF THE DRAWINGS

FIG. 1 is a process diagram for producing a laminate substrate (embodiment in which an adhesive sheet and a resin substrate are included) as an embodiment of the substrate for producing an organic EL device of the present invention, the substrate being used in an embodiment of the method for producing an organic EL device of the present invention:

(a) illustrating a step of preparing a resin substrate and an adhesive sheet, and (b) illustrating a step of laminating the resin substrate on the adhesive sheet.

FIG. 2 is a process diagram for describing a method for producing an adhesive sheet shown in FIG. 1(a):

(a) illustrating a step of forming a first adhesive layer on a release film, and (b) illustrating a step of forming a second adhesive layer on the first adhesive layer.

Figure 3:
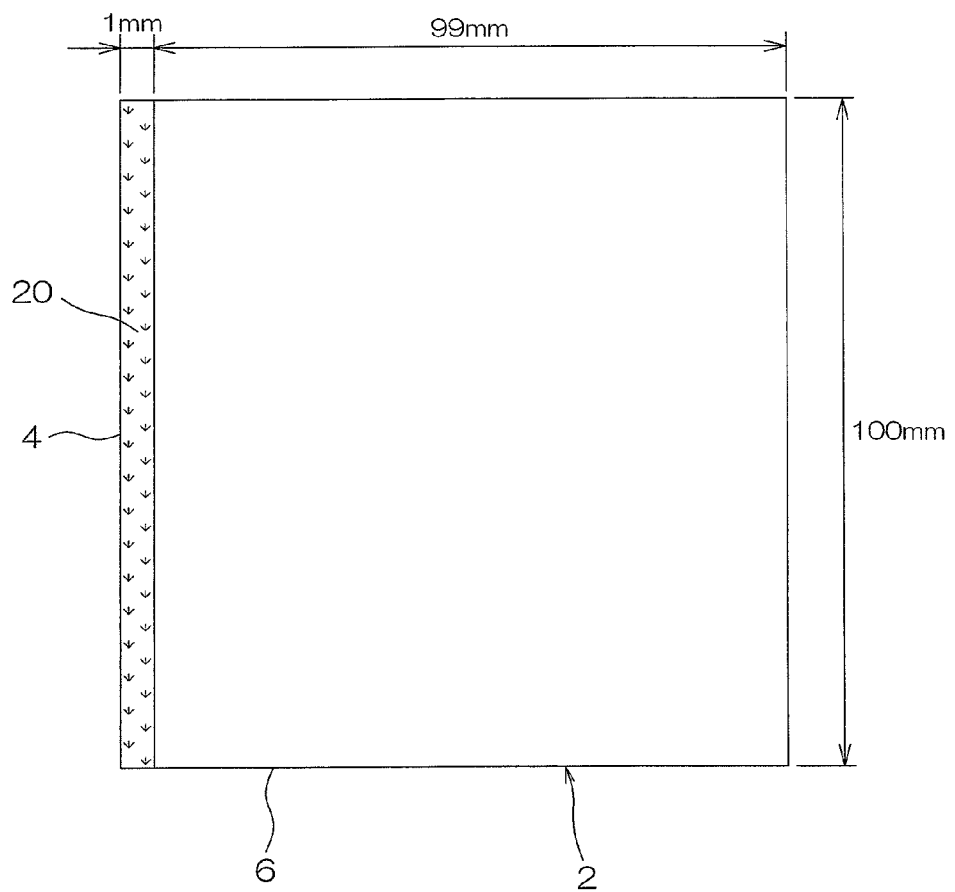

FIG. 3 shows a plan view of the adhesive sheet shown in FIG. 2(b).

Figure 4:
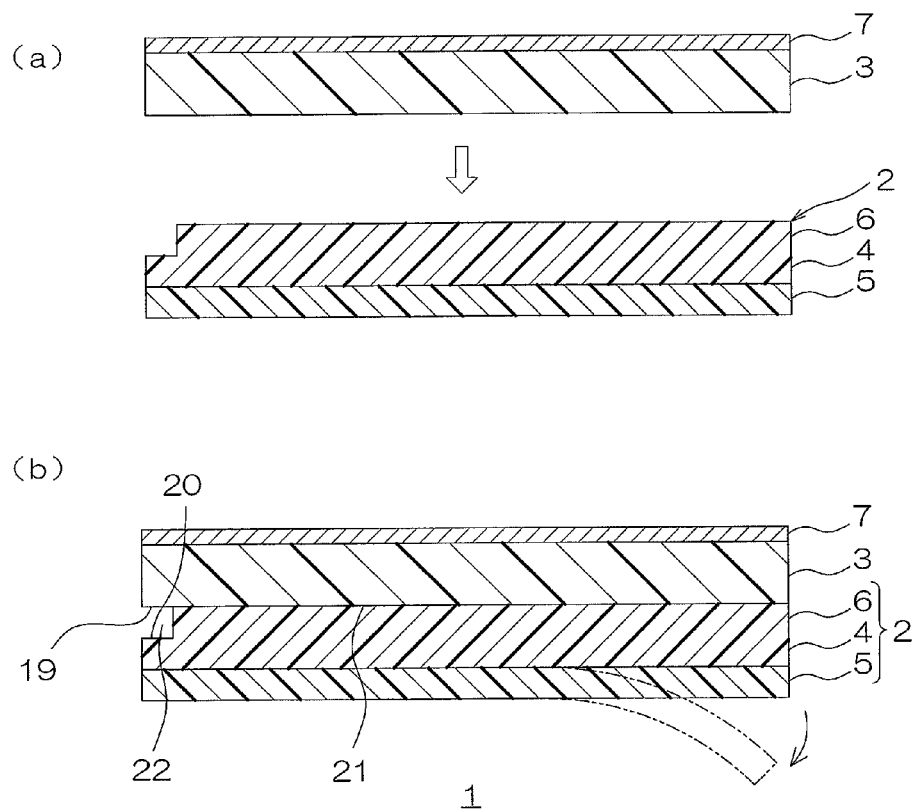

FIG. 4 is a process diagram for producing a laminate substrate (embodiment in which an adhesive sheet, a resin substrate, and a shielding layer are included) as another embodiment of the substrate for producing an organic EL device of the present invention, the substrate being used in an embodiment of the method for producing an organic EL device of the present invention, (a) illustrating a step of preparing a resin substrate on which a shielding layer is laminated, and an adhesive sheet, and (b) illustrating a step of laminating the resin substrate on the adhesive sheet.

FIG. 5 is a process diagram for producing a laminate substrate (embodiment in which an adhesive sheet, a resin substrate, a shielding layer, and a transparent conductive thin film are included) as another embodiment of the substrate for producing an organic EL device of the present invention, the substrate being used in an embodiment of the method for producing an organic EL device of the present invention:

(a) illustrating a step of preparing a resin substrate on which a shielding layer and a transparent conductive thin film are laminated, and an adhesive sheet, and (b) illustrating a step of laminating the resin substrate on the adhesive sheet.

FIG. 6 is a process diagram for describing a method for producing an organic EL device using the laminate substrate shown in FIG. 5(b):

(a) illustrating a step of allowing the resin substrate to adhere onto the hard substrate with an adhesive sheet interposed therebetween, (b) illustrating a step of forming an organic EL element on the resin substrate, and (c) illustrating a step of peeling the organic EL device from the hard substrate (embodiment in which interfacial peeling is caused at the interface between the resin substrate and the second adhesive layer).

FIG. 7 is a process diagram for describing another method for producing the adhesive sheet shown in FIG. 1(a):

(a) illustrating a step of preparing a first adhesive layer and a second adhesive layer, and (b) illustrating a step of forming the first adhesive layer below the second adhesive layer.

Figure 8:
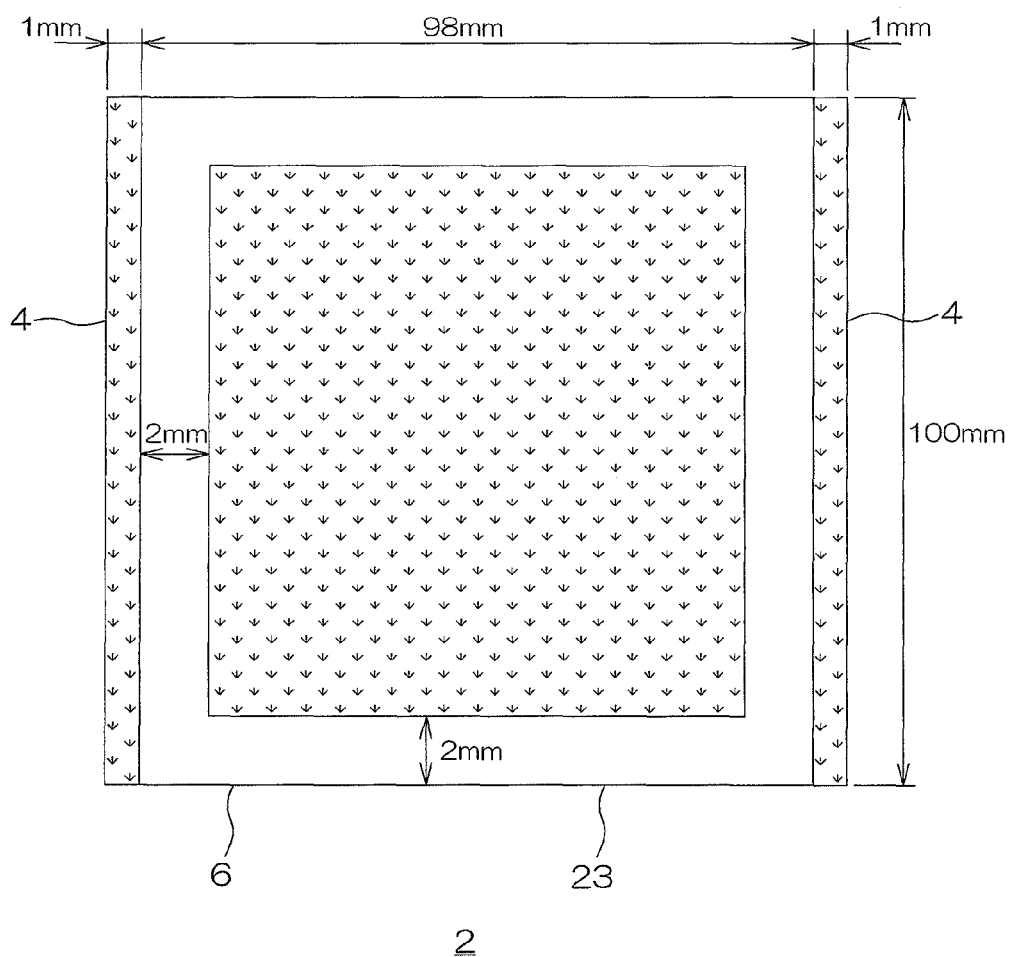

FIG. 8 shows a plan view of an adhesive sheet (embodiment in which the second adhesive layer includes a frame portion) of the laminate substrate in another embodiment of the substrate for producing an organic EL device of the present invention, the substrate being used in another embodiment of the method for producing an organic EL device of the present invention.

Figure 9:
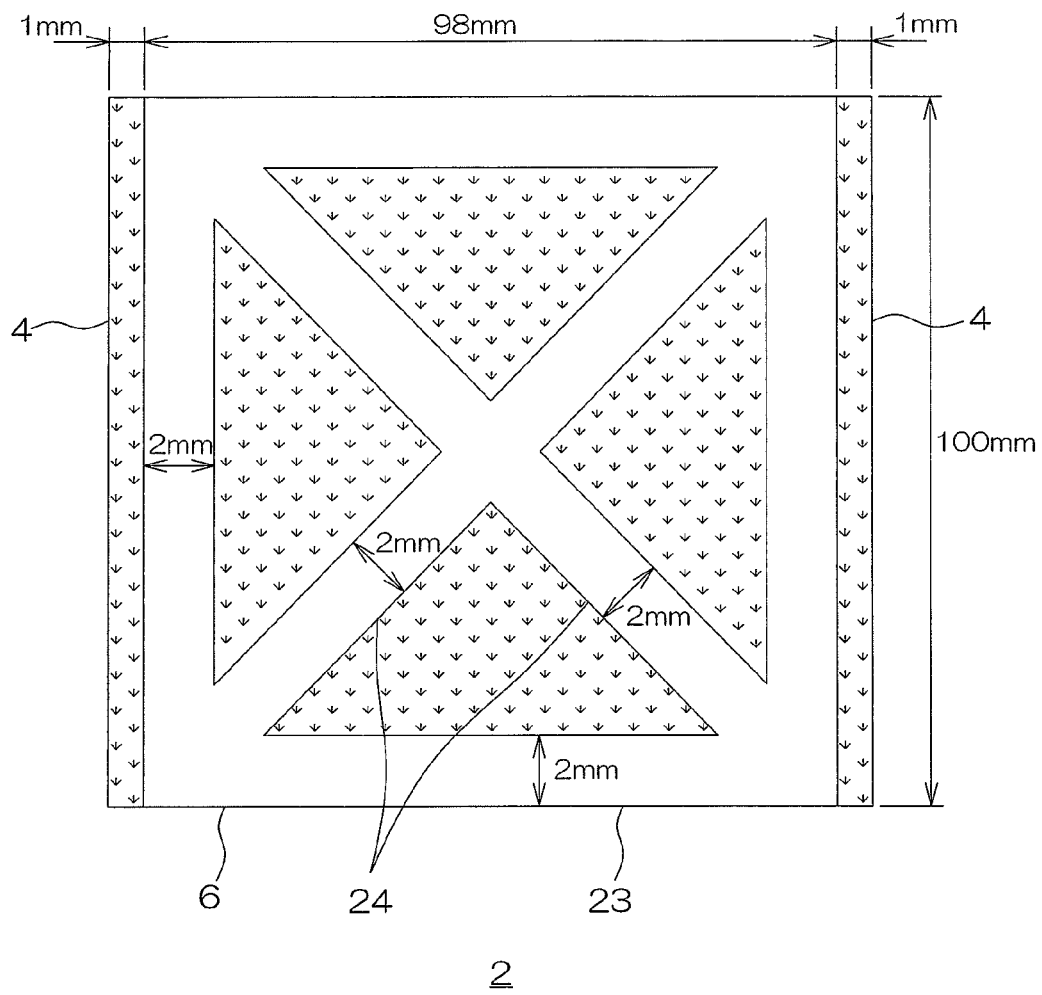

FIG. 9 shows a plan view of an adhesive sheet (embodiment in which the second adhesive layer includes a frame portion and an X-shaped portion) of the laminate substrate in another embodiment of the substrate for producing an organic EL device of the present invention, the substrate being used in another embodiment of the method for producing an organic EL device of the present invention.

DETAILED DESCRIPTION OF THE INVENTION

FIG. 1 is a process diagram for producing a laminate substrate (embodiment in which an adhesive sheet and a resin substrate are included) as an embodiment of the substrate for producing an organic EL device of the present invention, the substrate being used in an embodiment of the method for producing an organic EL device of the present invention; FIG. 2 is a process diagram for describing a method for producing an adhesive sheet shown in FIG. 1(a); FIG. 3 shows a plan view of the adhesive sheet shown in FIG. 2(b); FIG. 4 is a process diagram for producing a laminate substrate (embodiment in which an adhesive sheet, a resin substrate, and a shielding layer are included) as another embodiment of the substrate for producing an organic EL device of the present invention, the substrate being used in an embodiment of the method for producing an organic EL device of the present invention; FIG. 5 is a process diagram for producing a laminate substrate (embodiment in which an adhesive sheet, a resin substrate, a shielding layer, and a transparent conductive thin film are included) as another embodiment of the substrate for producing an organic EL device of the present invention, the substrate being used in an embodiment of the method for producing an organic EL device of the present invention; and FIG. 6 is a process diagram for describing a method for producing an organic EL device using the laminate substrate shown in FIG. 5(b).

In FIG. 1 (b), a laminate substrate 1 as an embodiment of the substrate for producing an organic EL device of the present invention includes an adhesive sheet 2 and a resin substrate 3 laminated on the adhesive sheet 2.

The adhesive sheet 2 has, as shown in FIG. 1(b) and FIG. 3, a generally rectangular shape when viewed from the top, and integrally includes, a first adhesive layer 4, and a second adhesive layer 6 formed on the first adhesive layer 4.

The first adhesive layer 4 is formed to match the outline shape of the adhesive sheet 2, and is disposed below the adhesive sheet 2.

The adhesive composition that forms the first adhesive layer 4 is a pressure-sensitive adhesive composition in which a generation amount of a component that affects an organic EL layer 13 (ref: FIG. 6 (b)) to be described later is decreased, and contains, for example, an acrylic polymer.

Acrylic polymers are obtained, for example, by polymerizing a monomer component mainly composed of alkyl (meth)acrylate.

Alkyl(meth)acrylates include alkyl acrylates and/or alkyl methacrylates, and examples thereof include alkyl(meth)

acrylate (alkyl moiety having 1 to 12 carbon atoms) having an alkyl moiety of a straight chain alkyl or a branched alkyl such as methyl(meth)acrylate, ethyl(meth)acrylate, n-propyl (meth)acrylate, isopropyl(meth)acrylate, n-butyl(meth)acrylate, isobutyl(meth)acrylate, sec-butyl(meth)acrylate, tert-butyl(meth)acrylate, n-pentyl(meth)acrylate, isopentyl (meth)acrylate, hexyl(meth)acrylate, heptyl(meth)acrylate, n-octyl(meth)acrylate, 2-ethylhexyl(meth)acrylate, isooctyl (meth)acrylate, nonyl(meth)acrylate, isononyl(meth)acrylate, n-decyl(meth)acrylate, isodecyl(meth)acrylate, undecyl (meth)acrylate, and dodecyl(meth)acrylate.

Alkyl(meth)acrylates can be used singly, or can be used in combination.

Of the above-described main components, preferably, alkyl acrylate (alkyl moiety having 2 to 8 carbon atoms) is used, and more preferably, ethyl acrylate or n-butyl acrylate is used.

The mixing ratio of alkyl (meth)acrylate relative to 100 mol of the monomer component is, for example, 50 to 99.9 mol, or preferably 60 to 99 mol. The mixing ratio of alkyl (meth)acrylate relative to 100 parts by mass of the monomer component is, for example, 50 to 99.9 parts by mass, or preferably 60 to 99 parts by mass.

The monomer component preferably contains a copolymerizable vinyl monomer that is copolymerizable with (meth)acrylate.

Examples of copolymerizable vinyl monomers include reactive group-containing vinyl monomers including hydroxyl group-containing vinyl monomers such as 2-hydroxyethyl(meth)acrylate, 3-hydroxypropyl(meth)acrylate, 4-hydroxybutyl(meth)acrylate, 5-hydroxypentyl(meth)acrylate, 6-hydroxyhexyl(meth)acrylate, 7-hydroxyheptyl(meth)acrylate, 8-hydroxyoctyl(meth)acrylate; and carboxyl group-containing vinyl monomers such as acrylic acid, methacrylic acid, fumaric acid, and maleic acid.

Examples of copolymerizable vinyl monomers also include polyfunctional vinyl monomers having a plurality of double bonds.

Examples of polyfunctional vinyl monomers include (mono or poly) alkyleneglycol di(meth)acrylate such as (mono or poly) ethylene glycol di(meth)acrylate including ethylene glycol di(meth)acrylate, diethylene glycol di(meth)acrylate, triethylene glycol di(meth)acrylate, trimethylolpropane tri (meth)acrylate, and tetraethylene glycol di(meth) acrylate, (mono or poly) propylene glycol di(meth)acrylate such as propylene glycol di(meth)acrylate; as well as polyhydric alcohols of (meth)acrylate monomers such as neopentyl glycol di(meth)acrylate, 1,6-hexanediol di(meth)acrylate, pentaerythritol di(meth)acrylate, trimethylolpropane tri (meth)acrylate, pentaerythritol tri(meth)acrylate, and dipentaerythritolhexa(meth)acrylate.

Copolymerizable vinyl monomers can be used alone, or can be used in combination of two or more.

Preferably, a reactive group-containing vinyl monomer is used, and more preferably, a hydroxyl group-containing vinyl monomer is used. When a hydroxyl group-containing vinyl monomer is used, hydroxyl groups are allowed to react with a reactive vinyl monomer and/or a cross-linking agent to be described later, and the first adhesive layer 4 can achieve a stronger adhesive effects.

The mixing ratio of the copolymerizable vinyl monomer relative to 100 mol of the (meth)acrylate is, for example, 0.1 to 50 mol, preferably 1 to 40 mol. The mixing ratio of the copolymerizable vinyl monomer relative to 100 parts by mass of (meth)acrylate is, for example, 0.1 to 50 parts by mass, preferably 1 to 40 parts by mass.

Acrylic polymers can be obtained, for example, by allowing the above-described monomer component to react in the presence of a polymerization initiator by a known polymerization method such as, for example, solution polymerization, bulk polymerization, or emulsion polymerization. Preferably, solution polymerization using an aromatic solvent such as toluene as a solvent is employed.

Examples of polymerization initiators include thermal polymerization initiators and photopolymerization initiators.

Examples of thermal polymerization initiators include peroxide thermal polymerization initiators such as benzoyl peroxide, t-butylhydroperoxide, and hydrogen peroxide; and azo thermal polymerization initiators such as 2,2'-azobisisobutyronitrile, 2,2'-azobis(2-methylpropioneamidine)disulfate, 2,2'-azobis(2-methylpropioneamidine) dihydrochloride, 2,2'-azobis(2-amidinopropane)dihydrochloride, 2,2'-azobis [N-(2-carboxyethyl)-2-methylpropioneamidine]hydrate, 2,2'-azobis(N,N'-dimethyleneisobutylamidine), and 2,2'-azobis[2-(2-imidazoline-2-yl) propane]dihydrochloride.

Examples of photopolymerization initiators include a benzoin ether photopolymerization initiator, an acetophenone photopolymerization initiator, an α-ketol photopolymerization initiator, a ketal photopolymerization initiator, a benzoin photopolymerization initiator, a benzyl photopolymerization initiator, a benzophenone photopolymerization initiator, a thioxanthone photopolymerization initiator, and a substituted alkyl photopolymerization initiator.

Examples of benzoin ether photopolymerization initiators include benzoin methyl ether, benzoin ethyl ether, benzoin propyl ether, benzoin isopropyl ether, benzoin isobutyl ether, and 2,2-dimethoxy-1,2-diphenylethan-1-one.

Examples of acetophenone photopolymerization initiators include 2,2-diethoxyacetophenone, 2,2-dimethoxy-2-phenylacetophenone, 1-hydroxycyclohexylphenylketone, 4-phenoxydichloroacetophenone, and 4-(t-butyl)dichloroacetophenone.

Examples of α-ketol photopolymerization initiators include 2-methyl-2-hydroxypropiophenone, and 1-[4-(2-hydroxyethyl) phenyl]-2-methylpropan-1-one.

Examples of ketal photopolymerization initiators include acetophenone diethyl ketal and benzyldimethyl ketal.

Examples of benzoin photopolymerization initiators include benzoin.

Examples of benzyl photopolymerization initiators include benzyl and dibenzyl.

Examples of benzophenone photopolymerization initiators include benzophenone, benzoylbenzoic acid, 3,3'-dimethyl-4-methoxybenzophenone, polyvinylbenzophenone, and α-hydroxycyclohexylphenylketone.

Examples of thioxanthone photopolymerization initiators include thioxanthone, 2-chlorothioxanthone, 2-methylthioxanthone, 2,4-dimethylthioxanthone, isopropylthioxanthone, 2,4-diisopropylthioxanthone, dodecylthioxanthone, and Michler's ketone chlorothioxanthone.

Examples of substituted alkyl photopolymerization initiators include 2-hydroxydimethylphenylpropane, and 2,2-dimethoxy-2-phenylacetophenone.

Polymerization initiators can be used singly, or can be used in combination.

As the polymerization initiator, preferably, a thermal polymerization initiator, and more preferably, an azo thermal polymerization initiator is used.

The mixing ratio of the polymerization initiator relative to 100 mol of the monomer component is, for example, 0.01 to 1 mol. The mixing ratio of the polymerization initiator relative to 100 parts by mass of the monomer component is, for example, 0.01 to 1 part by mass.

The adhesive composition contains an acrylic polymer obtained as described above, and preferably, in addition to the above-described acrylic polymer, a reactive vinyl monomer, a cross-linking agent, and a polymerization initiator are blended therein.

The reactive vinyl monomer contains, for example, both of a reactive group (preferably, isocyanate group) that is capable of reacting with the reactive group (preferably, hydroxyl group) of the above-described copolymerizable vinyl monomer (reactive group-containing vinyl monomer, preferably a hydroxyl group-containing vinyl monomer); and a double bond.

Examples of such reactive vinyl monomers include an isocyanate group-containing vinyl monomer such as 2-(meth)acryloyloxy ethylisocyanate.

The cross-linking agent is nonvolatile, and has a weight-average molecular weight (a standard polystyrene-based value by GPC measurement) of, for example, 10000 or less, preferably, in view of effectively forming a three-dimensional network at the time of crosslinking (curing), 5000 or less.

Examples of such cross-linking agents include an isocyanate cross-linking agent, an oxazoline cross-linking agent, a carbodiimide cross-linking agent, an epoxy cross-linking agent, an aziridine cross-linking agent, and a metal chelate cross-linking agent. Preferably, an isocyanate cross-linking agent (e.g., trimethylol modified 2,4-tolylene diisocyanate) is used.

As the polymerization initiator, the above-described polymerization initiators, preferably a photopolymerization initiator, and more preferably, a ketal photopolymerization initiator is used.

Reactive vinyl monomers, cross-linking agents, and polymerization initiators can be used alone, or can be used in combination of two or more.

Reactive vinyl monomers, cross-linking agents, and polymerization initiators can be blended in at the same time with the acrylic polymer, or can be blended sequentially at an appropriate timing.

Preferably, a reactive vinyl monomer is blended with an acrylic polymer, and then the mixture is allowed to react by heating the mixture to 30 to 70° C., and thereafter, a cross-linking agent and a polymerization initiator are blended into the mixture.

In the reaction between the acrylic polymer and the reactive vinyl monomer, the reactive group (hydroxyl group) of the copolymerizable vinyl monomer and the reactive group (isocyanate group) of the reactive vinyl monomer are allowed to react with each other (chemically bond). A double bond is introduced into the side chain of the acrylic polymer in this manner, thereby becoming a curable acrylic polymer (polymerizable acrylic polymer).

After the reaction, the product containing the curable acrylic polymer can be washed (refined) to remove by-products (e.g., low molecule weight component). The refinement is performed, for example, by reprecipitation method.

The weight-average molecular weight (a standard polystyrene-based value by GPC measurement) of the refined curable acrylic polymer is, for example, 100000 to 1000000, and the component having a molecule weight of 100000 or less is, for example, 10.0 mass % or less.

The reactive vinyl monomer is blended so that the reactive group (isocyanate group) of the reactive vinyl monomer relative to 100 mol of the reactive group (hydroxyl group) of the copolymerizable vinyl monomer is, for example, below 100 mol, preferably 1 to 95 mol. As described later, by adding, for example, thermal or optical energy thereafter to the curable acrylic polymer, the double bond portion of the curable acrylic polymer is further polymerized (that is, crosslinked (self-crosslinked)), and cured.

When a cross-linking agent is blended into the curable acrylic polymer, the cross-linking agent is, in curing reaction thereafter, polymerized (that is, crosslinked) with the double bond portion of the curable acrylic polymer.

The mixing ratio R1 of the cross-linking agent relative to 100 parts by mass of the curable acrylic polymer (total amount of the acrylic polymer and the reactive vinyl monomer) is, for example, 0.2 to 20 parts by mass, preferably 0.5 to 10 parts by mass.

When the polymerization initiator is blended into the curable acrylic polymer, the polymerization initiator accelerates the above-described polymerization reaction (crosslinking reaction) in the curing reaction thereafter.

The mixing ratio of the polymerization initiator relative to 100 parts by mass of the curable acrylic polymer (total amount of the acrylic polymer and the reactive vinyl monomer) is, for example, 0.2 to 20 parts by mass, preferably 1 to 5 parts by mass.

An adhesive composition in which a curable acrylic polymer, a cross-linking agent, and a polymerization initiator are blended is regarded as a curable adhesive composition.

Then, as shown in FIG. 2(a), the above-described adhesive composition is applied on the surface (top face) of a release film 5 (described later) by a known method, and thereafter dried, thereby producing a first adhesive layer 4.

The first adhesive layer 4 has a thickness of, for example, 1 to 200 μm, preferably 5 to 50 μm.

In the first adhesive layer 4, the above-described polymerization reaction (crosslinking reaction) progresses in the curing thereafter, and in this fashion, stronger adhesive effects are achieved.

A second adhesive layer 6 is formed continuously on the top face of the first adhesive layer 4. The second adhesive layer 6 is formed into a generally rectangular shape when viewed from the top so that an end portion (one end portion) of the first adhesive layer 4 is exposed, the end portion corresponding to a side of the first adhesive layer 4. That is, the second adhesive layer 6 is laminated on a central portion and the other end portion of the first adhesive layer 4.

An exposed portion 20 of the first adhesive layer 4 is formed so as to extend narrowly along a side of the first adhesive layer 4. The exposed portion 20 has a width (length in a direction perpendicular to the extending direction) of, for example, 400 to 5000 μm, preferably 400 to 3000 μm.

The adhesive composition that forms the second adhesive layer 6 is the same as the adhesive composition of the first adhesive layer 4.

To foam the second adhesive layer 6, as shown in FIG. 2(b), the above-described adhesive composition is applied on the surface (top face) of the first adhesive layer by a known method, and thereafter dried.

The second adhesive layer 6 has a thickness of, for example, 0.5 to 100 μm, preferably 1 to 25 μm.

In the second adhesive layer 6, the polymerization reaction (crosslinking reaction) progresses in the curing thereafter, and in this fashion, stronger adhesive effects are achieved integrally with the first adhesive layer 4.

The adhesive sheet 2 including the first adhesive layer 4 and the second adhesive layer 6 is obtained in this manner.

A release film 5 can also be formed below the bottom face of the adhesive sheet 2.

The release film 5 is formed below the entire bottom face of the first adhesive layer 4, and is formed into the same shape as that of the first adhesive layer 4 when viewed from the top.

Examples of the release film 5 include a surface treated (to be specific, treated for releasing) PET film.

In FIG. 2(*b*), the border between the first adhesive layer 4 and the second adhesive layer 6 is shown by the broken line. However, the boundary does not appear actually, and the first adhesive layer 4 and the second adhesive layer 6 are bonded to each other to be formed integrally.

The resin substrate 3 is formed into a generally rectangular shape when viewed from the top, to be more specific, as shown in FIG. 1, formed so that the second adhesive layer 6 is included when projected in the thickness direction. In detail, when the resin substrate 3 is projected in the thickness direction, its peripheral end edge coincide with the peripheral end edge of the first adhesive layer 4, and is formed into the same shape as that of the first adhesive layer 4.

At an end portion (one end portion) corresponding to a side of the resin substrate 3, a non-adhesive region 19 that does not overlap with the second adhesive layer 6 but overlaps with the first adhesive layer 4 when projected in the thickness direction is defined.

The non-adhesive region 19 is formed, at a facing surface (bottom face) of the resin substrate 3, the facing surface facing the adhesive sheet 2; into a generally rectangular shape (belt-shape) when viewed from the bottom; and extending narrowly along one end portion corresponding to a side of the resin substrate 3, between two sides adjacent to the side at both end portions of the side.

The non-adhesive region 19 is disposed to face the exposed portion 20 of the first adhesive layer 4 with a space (gap to be described later) interposed therebetween in the thickness direction. That is, a gap 22 is formed between the non-adhesive region 19 of the resin substrate 3 and the exposed portion 20 of the first adhesive layer 4.

The gap 22 is marked off at the outside (left side in FIG. 1(*b*)) of one end face of the second adhesive layer 6 between the non-adhesive region 19 of the resin substrate 3 and the exposed portion 20 of the first adhesive layer 4, and is formed into a generally rectangular shape communicating with the outside (one side, external portion) when viewed in cross section.

The width of the gap 22 is substantially the same as the width of the above-described exposed portion 20 of the first adhesive layer 4. To be specific, the width of the gap 22 is narrower than the width of the second adhesive layer 6, and is, for example, 1 to 90%, preferably 1 to 10% relative to the width of the second adhesive layer 6.

The thickness of the gap 22 is substantially the same as the thickness of the second adhesive layer 6.

In the resin substrate 3, the region disposed adjacently on the right side (the other side) of the non-adhesive region 19 and is bonded to the first adhesive layer 4 is defined as an adhesive region 21.

The resin substrate 3 is composed of a transparent or flexible sheet, and examples of such a transparent flexible material include the above-described thermoplastic resins. Preferably, in view of low costs, polyester is used.

The resin substrate 3 has a thickness of, for example, 1 to 500 μm, preferably 10 to 100 μm.

To obtain the laminate substrate 1, as shown in FIG. 1(*a*), the resin substrate 3 and the adhesive sheet 2 are prepared individually, and then the resin substrate 3 is bonded to the top face of the second adhesive layer 6 of the adhesive sheet 2. In other words, the second adhesive layer 6 is bonded to the adhesive region 21 of the resin substrate 3.

The laminate substrate 1 including the adhesive sheet 2 and the resin substrate 3 can be obtained in this manner.

Furthermore, as shown in FIG. 7, the adhesive sheet 2 can be formed by a method in which the first adhesive layer 4 is formed on the top face of the release film 5 (phantom line), and separately, the second adhesive layer 6 is formed on the bottom face of the resin substrate 3, and then the second adhesive layer 6 is transferred to the first adhesive layer 4.

Furthermore, as shown in FIG. 4 (*b*), a shielding layer 7 can also be provided in the laminate substrate 1.

The shielding layer 7 is formed on the entire top face of the resin substrate 3. The shielding layer 7 is a gas barrier layer for preventing (blocking) gas from permeating the resin substrate 3, and to shield an organic EL layer 13 (ref: FIG. 6 (*b*)) to be described later. Examples of gases include water vapor, and air (including oxygen).

Examples of materials that form the shielding layer 7 include inorganic insulating materials such as SiN, SiC, and a thin metal film.

The shielding layer 7 has a thickness of, for example, 0.01 to 100 μm, preferably 0.1 to 10 μm.

To obtain such a laminate substrate 1, as shown in FIG. 4(*a*), for example, the shielding layer 7 is formed on the resin substrate 3 by sputtering, and thereafter, as shown in FIG. 4(*b*), the resin substrate 3 on which the shielding layer 7 is formed is bonded on the adhesive sheet 2.

As shown in FIG. 5 (*b*), a transparent conductive thin film 8 can also be provided on the above-described laminate substrate 1 in addition to the above-described shielding layer 7.

The transparent conductive thin film 8 is formed on the entire top face of the shielding layer 7. The transparent conductive thin film 8 will be an electrode (to be specific, an anode 11, ref: FIG. 6 (*b*)) by patterning to be described later.

Examples of transparent conductive materials that form the transparent conductive thin film 8 include oxides such as indium-tin composite oxide (ITO).

The transparent conductive thin film 8 has a thickness of, for example, 10 to 1000 nm, preferably 50 to 500 nm.

Such a transparent conductive thin film 8 has a surface resistance of, for example, in view of ensuring a predetermined transparency, 1 to 50Ω/□. The surface resistance is measured by the four probe method.

By providing the transparent conductive thin film 8 on the laminate substrate 1 in advance, in the step of forming the anode 11 (ref: FIG. 6 (*b*)) thereafter, the anode 11 can be formed easily just by patterning without laminating the transparent conductive thin film 8 separately.

To obtain such a laminate substrate 1, for example, first, as shown in FIG. 4 (*a*), the shielding layer 7 is formed on the resin substrate 3, then, as shown in FIG. 5 (*a*), the transparent conductive thin film 8 is formed on the shielding layer 7. The transparent conductive thin film 8 is formed, for example, by a known thin film forming method, such as vapor deposition including vacuum deposition.

Thereafter, as shown in FIG. 5 (*b*), the resin substrate 3 with the shielding layer 7 and the transparent conductive thin film 8 formed successively thereon is bonded on the second adhesive layer 6 of the adhesive sheet 2.

Next, a method for producing an organic EL device 18 using the laminate substrate 1 shown in FIG. 5 (*b*) is described with reference to FIG. 6.

In this method, as shown in FIG. 5 (*b*), first, an adhesive sheet 2 with the resin substrate 3 laminated thereon, that is, the above-described laminate substrate 1 is prepared.

Next, in this method, as shown in FIG. 6 (*a*), the resin substrate 3 of the laminate substrate 1 is allowed to adhere onto a hard substrate 9 with the adhesive sheet 2 interposed therebetween.

That is, by bonding the first adhesive layer 4 on the top face of the hard substrate 9, the resin substrate 3 is allowed to adhere onto the hard substrate 9. In other words, the bottom face of the first adhesive layer 4 is bonded to the hard substrate 9.

The hard substrate 9 has a generally rectangular shape when viewed from the top. To be more specific, the hard substrate 9 is formed so as to include the first adhesive layer 4 when projected in the thickness direction. In detail, the hard substrate 9 is formed to have the same shape as that of the first adhesive layer 4 when projected in the thickness direction.

In this way, the bonding area S1 to be bonded to the hard substrate 9 in the first adhesive layer 4 is larger than the bonding area S2 to be bonded to the resin substrate 3 in the second adhesive layer 6.

In other words, the bonding area S2 to be bonded to the resin substrate 3 in the second adhesive layer 6 is smaller than the bonding area S1 to be bonded to the hard substrate 9 in the first adhesive layer 4.

To be specific, the bonding area S2 to be bonded to the hard substrate 9 in the first adhesive layer 4 of the adhesive sheet 2 relative to the bonding area S1 to be bonded to the hard substrate 9 in the second adhesive layer 6 is, for example, 10 to 99%, preferably 50 to 99%.

When the ratio of S2 to S1 (S2/S1) is below the above-described range, the proportion of the non-adhesive region 19 in the resin substrate 3 becomes excessively large, and therefore the resin substrate 3 at the non-adhesive region 19 may undergo a slight deformation (e.g., flexion).

When the ratio of S2 to S1 (S2/S1) exceeds the above-described range, the proportion of the non-adhesive region 19 in the resin substrate 3 becomes excessively small, and the peeling to be described later from the non-adhesive region 19 may not be performed reliably.

Examples of hard materials that form the hard substrate 9 include inorganic hard materials such as glass, ceramics, and metal (e.g., iron, aluminum, and stainless steel). Preferably, in view of transparency (ease of light irradiation of the adhesive composition to be described later), when a photopolymerization initiator is blended in the curable acrylic polymer, glass is used.

The hard substrate 9 has a thickness of, for example, 0.5 to 2 mm.

Next, in this method, as shown in FIG. 6 (b), an organic EL element 10 is formed on the resin substrate 3.

The organic EL element 10 is a known organic EL element, and includes, for example, an anode 11, an insulating layer 12, an organic EL layer 13, and a cathode 14. The organic EL element 10 also include, for example, a sealing layer 15, an anode terminal 16 connected to the anode 11, a sealing layer 15 that seals in the cathode 14, and a cathode terminal 17.

The anode 11 is formed on the shielding layer 7, and is formed, for example, by forming the transparent conductive thin film 8 shown in FIG. 6 (b) into a pattern by a known patterning method such as etching.

The insulating layer 12 is formed on the shielding layer 7 so as to cover one end of the transparent conductive thin film 8.

The organic EL layer 13 is formed on the anode 11 and the insulating layer 12.

The cathode 14 is formed on the shielding layer 7 and the insulating layer 12 so as to cover the organic EL layer 13.

The sealing layer 15 is formed to cover one end, and to expose the other end of the cathode 14. The other end of the cathode 14 exposed from the sealing layer 15 serves as the cathode terminal 17.

The anode terminal 16 is formed so that one end thereof is in contact with the anode 11 and is sealed in with the sealing layer 15, and the other end thereof is exposed from the sealing layer 15.

Examples of materials for the members included in the organic EL element 10 are those materials for the members included in a known organic EL element. Examples of electrode materials that form the anode 11 include the above-described transparent conductive materials.

To form the above-described organic EL element 10 on the resin substrate 3, for example, first, the anode 11 is formed from the transparent conductive thin film 8 by a known patterning method.

Then, the insulating layer 12, the organic EL layer 13, the cathode 14 (including the cathode terminal 17), the anode terminal 16, and the sealing layer 15 are formed successively by a known method.

The organic EL element 10 formed on the resin substrate 3 (shielding layer 7) is obtained in this manner.

In this fashion, an organic EL device 18 including the resin substrate 3, the shielding layer 7, and the organic EL element 10 that is allowed to adhere onto the hard substrate 9 with the adhesive sheet 2 interposed therebetween is produced.

Thereafter, when the adhesive composition in the first adhesive layer 4 and the second adhesive layer 6 contains a curable acrylic polymer and/or a cross-linking agent, the curable acrylic polymer and/or the cross-linking agent are allowed to react by energy of, for example, heat or light.

Preferably, the adhesive composition is cured by light irradiation to allow polymerization reaction of double bonds in the curable acrylic polymer to progress.

In particular, light, preferably, ultraviolet light, to be specific, ultraviolet light having a wavelength of 100 to 400 nm is used to irradiate from the hard substrate 9 side toward the adhesive sheet 2.

The irradiation is performed such that the adhesive sheet 2 is exposed at, for example, 100 to 10000 mJ/cm$^2$ in total.

In this fashion, the adhesive composition in the adhesive sheet 2 is cured.

Thereafter, as shown by the arrow in FIG. 6 (c), the organic EL device 18 is peeled upward from the hard substrate 9.

To be specific, the resin substrate 3 and the hard substrate 9 are peeled from the non-adhesive region 19 of the resin substrate 3.

Then, peeling between the adhesive region 21 of the resin substrate 3 and the second adhesive layer 6 occurs, taking priority over peeling between the hard substrate 9 and the first adhesive layer 4.

As a result, the adhesive sheet 2 remains (sticks) on the hard substrate 9.

By the above-described peeling, the organic EL device 18 can be obtained.

In the above-described method, in the step of peeling the organic EL device 18 from the hard substrate 9, peeling can be performed from the non-adhesive region 19, consistently at the interface between the adhesive region 21 and the second adhesive layer 6.

Moreover, the bonding area S2 to be bonded to the resin substrate 3 in the second adhesive layer 6 is formed smaller compared with the bonding area S1 to be bonded to the hard substrate 9 in the first adhesive layer 4. Therefore, the adhesive strength of the second adhesive layer 6 as a whole relative to the resin substrate 3 is smaller than the adhesive strength of the first adhesive layer 4 as a whole relative to the hard substrate 9.

In this way, while preventing interfacial peeling between the hard substrate 9 and the first adhesive layer 4, interfacial peeling between the adhesive region 21 of the resin substrate 3 and the second adhesive layer 6 can be caused reliably.

Thus, the adhesive sheet 2 that is unnecessary for the produced organic EL device 18 can be left at the hard substrate 9, and the adhesive sheet 2 can be prevented reliably from remaining at the resin substrate 3 included in the organic EL device 18.

Therefore, a highly reliable organic EL device 18 can be produced.

Although it depends on the materials of the resin substrate 3 and the hard substrate 9, the adhesive strength A2 (peel strength) of the second adhesive layer 6 (per unit area) to the resin substrate 3 and the adhesive strength A1 (peel strength) of the first adhesive layer 4 (per unit area) to the hard substrate 9 are, for example, substantially the same, or A2 can be set smaller than A1.

FIG. 8 shows a plan view of an adhesive sheet (embodiment in which the second adhesive layer includes a frame portion) of the laminate substrate in another embodiment of the substrate for producing an organic EL device of the present invention, the substrate being used in another embodiment of the method for producing an organic EL device of the present invention, and FIG. 9 is a plan view of an adhesive sheet (embodiment in which the second adhesive layer includes a frame portion and an X-shaped portion) of the laminate substrate of another embodiment of the substrate for producing an organic EL device of the present invention, the substrate being used in another embodiment of the method for producing an organic EL device of the present invention.

In the following figures, those members corresponding to the above-described elements are designated with the same reference numerals, and detailed descriptions thereof are omitted.

In the embodiment of FIG. 3, the second adhesive layer 6 is formed into a generally rectangular shape when viewed from the top so that one end portion corresponding to a side of the first adhesive layer 4 is exposed. However, for example, as shown in FIG. 8, the second adhesive layer 6 can also be formed so that both end portions corresponding to two sides facing each other of the first adhesive layer 4 are exposed.

In FIG. 8, the second adhesive layer 6 includes a frame portion 23 having a generally frame shape when viewed from the top. The second adhesive layer 6 allows the first adhesive layer 4 to expose in a generally rectangular shape when viewed from the top at both outsides (one side and the other side) of the frame portion 23, and allows the first adhesive layer 4 to expose in a generally rectangular shape when viewed from the top at inside of the frame portion 23.

In the resin substrate 3, the non-adhesive region 19 is formed into a shape that corresponds to the shape of the frame portion 23.

In the embodiment of FIG. 8, the second adhesive layer 6 is opened into a generally rectangular shape when viewed from the top. However, for example, as shown in FIG. 9, the second adhesive layer 6 can also be formed to into a pattern that include an X-shaped portion 24 inside the frame portion 23, the X-shaped portion 24 connecting the vertices of the frame portion 23, and formed into an X shape.

The X-shaped portion 24 is formed into diagonal lines connecting the vertices of the frame portion 23 when viewed from the top.

In this way, the second adhesive layer 6 allows the first adhesive layer 4 to expose in a generally rectangular shape when viewed from the top at both outsides of the frame portion 23, and allows the first adhesive layer 4 to expose in a generally triangular shape when viewed from the top surrounded by the frame portion 23 and the X-shaped portion 24.

In the embodiment of FIG. 3, the second adhesive layer 6 is formed so that one end portion corresponding to a side of the first adhesive layer 4 is exposed, and in the embodiment of FIG. 8 and FIG. 9, the second adhesive layer 6 is formed so that both end portions corresponding to two sides facing each other of the first adhesive layer 4 are exposed. However, for example, although not shown, the second adhesive layer 6 can also be formed so that three end portions corresponding three sides of the first adhesive layer 4 are exposed, and furthermore, can also be formed so that peripheral end portions corresponding to four sides of the first adhesive layer 4 are exposed.

Furthermore, in the above-described embodiments, the adhesive sheet 2 is formed from the first adhesive layer 4 and the second adhesive layer 6. However, for example, as shown in FIG. 2(b), a supporting sheet (not shown) can be interposed between the first adhesive layer 4 and the second adhesive layer 6 along the broken line.

Furthermore, the first adhesive layer 4 can be formed from a plurality of layers, and the second adhesive layer 6 can be formed from a plurality of layers.

EXAMPLE

Hereinafter, the present invention is described in further detail with reference to Preparation Examples, Examples, and Comparative Examples. However, the present invention is not limited to those described in these Examples.

Preparation Example 1

(Preparation of Adhesive Composition)

To a 500 ml reactor having a thermometer, a mixer, a nitrogen inlet tube, and a reflux condensing tube, a monomer component (180.6 g) containing 0.59 mol (59 g) of ethyl acrylate, 0.59 mol (75.5 g) of n-butyl acrylate, and 0.26 mol (45.8 g) of acrylic acid 6-hydroxyhexyl; 2 mmol (0.33 g) of 2,2'-azobisisobutyronitrile; and 19.4 g of toluene were placed and stirred while introducing nitrogen gas for 1 hour, and air in the reactor was replaced with nitrogen. Thereafter, the system was heated at a temperature of 60° C., and such a state was kept for 6 hours, thereby causing polymerization reaction of the above-described monomer component, and producing a toluene solution of acrylic polymer.

Subsequently, in the toluene solution of acrylic polymer, 0.21 mol (50.8 g) of 2-methacryloyloxyethylisocyanate (reactive vinyl monomer) was blended, and the mixture was heated to 55° C., thereby allowing reaction to occur. That is, the hydroxyl group in the acrylic acid 6-hydroxyhexyl and the isocyanate group in the 2-methacryloyloxyethylisocyanate were allowed to react in a polycondensation reaction, thereby producing a curable acrylic polymer in which an unsaturated bond (carbon-carbon double bond) was introduced in the side chain of the acrylic polymer.

The chain length of the side chain (to be specific, $-COO-(CH_2)_6-OCONH-C_2H_4-COC\ (CH_3)=CH_2$) of the curable acrylic polymer is, 16 by the number of atoms (number of atoms (such as C, O, and N) arranged in series in the side chain, C was 13, O was 2, N was 1).

Thereafter, the obtained curable acrylic polymer was purified by methanol reprecipitation method, thereby removing low molecule weight components. In the purified curable acrylic polymer, the weight-average molecular weight calculated by a standard polystyrene-based value by GPC measurement was 600000, and the component having a molecule weight of 100000 or less was 7.3 wt %.

Then, 2 parts by mass of a cross-linking agent (trade name: CORONATER L, isocyanate cross-linking agent, trimethylol modified 2,4-tolylene diisocyanate, isocyanate content 12.7 to 13.7 mass %, manufactured by Nippon Polyurethane Industry Co., Ltd.), and 5 parts by mass of a photopolymerization initiator (Irgacure 651, benzyldimethylketal, manufactured by Ciba Specialty Chemicals plc.) were added to 100 parts by mass of the curable acrylic polymer, and the mixture was blended uniformly, thereby producing an adhesive composition.

Example 1

(Production of Laminate Substrate)

A release film (PET film with its surface treated for releasing) composed of PET and having a thickness of 25 μm and a size of 100 mm×100 mm was prepared, and the adhesive composition of Preparation Example 1 was applied on the entire top face of the release film so that the thickness after drying thereof was 10 μm, and thereafter dried, thereby forming a first adhesive layer (ref: FIG. 2(a)).

Then, the adhesive composition of Preparation Example 1 was applied on a predetermined portion of the first adhesive layer so that the thickness after drying was 10 μm, and thereafter dried, thereby forming a second adhesive layer.

That is, the second adhesive layer was formed so that one end portion along a side of the first adhesive layer, that is, a portion having a width of 1 mm from the end edge of the side, is exposed (ref: FIG. 2(b) and FIG. 3).

An adhesive sheet including the release film, the first adhesive layer, and the second adhesive layer was thus made.

Separately, a resin substrate composed of PET having a thickness of 50 μm, and a size of 100 mm×100 mm was prepared; then a shielding layer composed of SiC having a thickness of 0.5 μm was formed on the top face of the resin substrate by sputtering (ref: FIG. 4(a)); and thereafter, a transparent conductive thin film composed of ITO having a thickness of 130 nm was formed on the top face of the shielding layer by vacuum deposition (ref: FIG. 5(a)).

The surface resistance (sheet resistance) of the transparent conductive thin film was measured and found to be 10Ω/□.

Then, the resin substrate with the shielding layer and the transparent conductive thin film successively formed thereon was bonded on the top face of the second adhesive layer of the adhesive sheet.

In particular, a non-adhesive region having a width of 1 mm and a length of 100 mm was defined at an end portion of a side of the resin substrate, the non-adhesive region not overlapping with the second adhesive layer but overlapping with the first adhesive layer when projected in the thickness direction.

Furthermore, between the non-adhesive region and the exposed portion of the first adhesive layer, a gap having a width of 1 mm was formed.

An adhesive sheet in which the resin substrate, the shielding layer, and the transparent conductive thin film were laminated thereon successively, that is, a laminate substrate was thus made (ref: FIG. 5(b)).

A gap was formed between the non-adhesive region of the resin substrate and the first adhesive layer. The bonding area (S2) to be bonded to the resin substrate in the adhesive sheet (second adhesive layer) relative to the bonding area (S1) to be bonded to the hard substrate in the adhesive sheet (first adhesive layer) was 99%.

(Production of Organic EL Device)

The resin substrate of the laminate substrate was allowed to adhere onto a hard substrate composed of glass with a thickness of 2 mm, and a size of 100 mm×100 mm with the adhesive sheet interposed therebetween (ref: FIG. 6(a)).

That is, by bonding the first adhesive layer of the adhesive sheet on the top face of the hard substrate, the resin substrate was allowed to adhere onto the hard substrate.

Then, an organic EL element was formed on the resin substrate. To be specific, the laminate substrate and the hard substrate were introduced into an organic EL element prototype test system (Try-ELVESS, manufactured by TOKKI Corporation), and an organic EL element was made on the shielding layer (ref: FIG. 6(b)).

In this fashion, an organic EL device including the resin substrate, the shielding layer, and the organic EL element was produced on the adhesive sheet.

Thereafter, ultraviolet rays having a center wavelength of 365 nm was irradiated from the hard substrate side toward the adhesive sheet, at a total exposure of 1500 mJ/cm$^2$.

The adhesive composition was thus cured.

Thereafter, the organic EL device was peeled from the glass substrate along the non-adhesive region (ref: FIG. 6(c)).

Thereafter, the bottom face of the resin substrate was observed, and it was confirmed that the adhesive sheet did not remain.

On the other hand, as the top face of the hard substrate was observed, it was confirmed that the adhesive sheet remained.

This clarifies that interfacial peeling occurred at an interface between the resin substrate and the adhesive sheet (second adhesive layer).

A series of the above-described production of an organic EL device, curing of an adhesive sheet, and peeling of an organic EL device was repeated a plurality of times.

It was confirmed from the result that in any of the cases, the adhesive sheet did not remain at the bottom face of the resin substrate.

Example 2

A laminate substrate was made in the same manner as in Example 1, except that the shape of the second adhesive layer was changed to a pattern including a frame portion and an X-shaped portion (ref: FIG. 9).

Non-adhesive regions of the resin substrate were defined at both end portions along two sides at both outsides of the frame portion, and at four triangular portions surrounded by the frame portion and the X-shaped portion.

The bonding area (S2) to be bonded to the resin substrate in the adhesive sheet (second adhesive layer) relative to the bonding area (S1) to be bonded to the hard substrate in the adhesive sheet (first adhesive layer) was 12.9%.

After the production of the laminate substrate, production of the organic EL device, curing of the adhesive sheet, and peeling of the organic EL device were performed in the same manner as in Example 1.

Then, a series of the above-described operation was repeated a plurality of times.

It was confirmed from the result that in any of the cases, the adhesive sheet did not remain at the bottom face of the resin substrate.

Example 3

A laminate substrate was made in the same manner as in Example 1, except that the shape of the second adhesive layer was changed to a pattern of a frame portion (ref: FIG. 8).

Non-adhesive regions of the resin substrate were defined at end portions along two sides at both outsides of the frame portion, and at a rectangular portion surrounded by the frame portion. The bonding area to be bonded to the resin substrate in the adhesive sheet (second adhesive layer) relative to the bonding area to be bonded to the hard substrate in the adhesive sheet (first adhesive layer) was 7.8%.

After the production of the resin substrate, production of the organic EL device, curing of the adhesive sheet, and peeling of the organic EL device were performed in the same manner as in Example 1.

Then, a series of the above-described operation was repeated a plurality of times.

It was confirmed from the result that in any of the cases, the adhesive sheet did not remain at the bottom face of the resin substrate.

However, because of a large proportion of the non-adhesive region in the resin substrate, it was confirmed that a slight flexion was caused in the resin substrate.

Comparative Example 1

A laminate substrate was made in the same manner as in Example 1, except that the second adhesive layer was formed on the entire top face of the first adhesive layer.

The adhesive sheet (second adhesive layer) was bonded on the entire bottom face of the resin substrate. The bonding area to be bonded to the resin substrate in the adhesive sheet (second adhesive layer) and the bonding area to be bonded to the hard substrate in the adhesive sheet (first adhesive layer) was the same.

Thereafter, production of an organic EL device, curing of the adhesive sheet, and peeling of the organic EL device were performed. Peeling of the organic EL device was performed by applying a stress on a side of the resin substrate, and using the side as a starting point.

Then, a series of the above-described operation was repeated a plurality of times.

The result showed mixed cases: both cases of remaining adhesive sheet at the bottom face of the resin substrate, and remaining adhesive sheet at the top face of the hard substrate were confirmed.

That is, peeling occurred at both of the interface between the resin substrate and the adhesive sheet, and at the interface between the hard substrate and the adhesive sheet.

(Evaluation of Adhesive Strength of Cured Adhesive Layer to Resin Substrate and Hard Substrate)

An adhesive composition was applied on the surface of a substrate (thickness 38 μm, composed of PET) so that the thickness after drying was 20 μm, and thereafter dried, thereby forming an adhesive layer. A test sheet was thus made.

Thereafter, the test sheet was processed to give a width of 20 mm, and then the test sheets were bonded to a glass-made hard substrate and a PET-made resin substrate, respectively, with the adhesive layer interposed therebetween.

Thereafter, the adhesive layers were irradiated with ultraviolet rays having a center wavelength of 365 nm by a high-pressure mercury lamp, at a total exposure of 1500 mJ/cm$^2$ from the hard substrate side and the resin substrate side, thereby curing the adhesive layers.

Thereafter, in conformity with JIS Z0237, the 180 degree peel adhesive strength (peel strength) of the adhesive layer to the glass substrate and the PET substrate was measured.

As a result, it was confirmed that the peel strength of the adhesive layer to the hard substrate and the peel strength of the adhesive layer to the resin substrate were the same, to be specific, 0.08N (8.16 gf/20 mm).

While the illustrative embodiments of the present invention are provided in the above description, such is for illustrative purpose only and it is not to be construed as limiting the scope of the present invention. Modifications and variations of the present invention that will be obvious to those skilled in the art is to be covered by the appended claims.

What is claimed is:

1. A method for producing an organic EL device, the method comprising the steps of:
    preparing an adhesive sheet on which a resin substrate is laminated;
    allowing the resin substrate to adhere onto a hard substrate with the adhesive sheet interposed therebetween;
    forming an organic EL element on the resin substrate, thereby producing an organic EL device including the resin substrate and the organic EL element;
    peeling the organic EL device from the hard substrate;
    wherein the adhesive sheet comprises
    a first adhesive layer for being bonded to the hard substrate;
    a second adhesive layer formed on the first adhesive layer and bonded to the resin substrate;
    a non-adhesive region is defined at an end portion of the resin substrate, the non-adhesive region not overlapping with the second adhesive layer but overlapping with the first adhesive layer when projected in the thickness direction; and
    the organic EL device is peeled from the non-adhesive region of the hard substrate.

2. The method for producing an organic EL device according to claim 1, wherein the bonding area to be bonded to the resin substrate in the adhesive sheet is smaller than the bonding area to be bonded to the hard substrate in the adhesive sheet.

3. The method for producing an organic EL device according to claim 1, wherein the bonding area to be bonded to the resin substrate in the adhesive sheet is 10 to 99% relative to the bonding area to be bonded to the hard substrate in the adhesive sheet.

4. The method for producing an organic EL device according to claim 1, further comprising the step of curing the adhesive sheet after the step of producing the organic EL device.

* * * * *